United States Patent
Noda et al.

[11] Patent Number: 5,645,937
[45] Date of Patent: Jul. 8, 1997

[54] THIN FILM LAYERED MEMBER

[75] Inventors: Shoji Noda, Aichi-ken; Kiyoshi Uchida, Toyota; Akio Itoh, Nagoya; Kazuo Higuchi, Seto; Mikio Niimi, Handa; Shun-ichi Murasaki, Nagoya; Yoshinobu Honkura, Aichi-ken, all of Japan

[73] Assignees: Kabushiki Kaisha Toyota Chuo Kenkyusho, Aichi-ken; Aichi Steel Works, Ltd., Tokai, both of Japan

[21] Appl. No.: 579,764

[22] Filed: Dec. 28, 1995

[30] Foreign Application Priority Data

Dec. 28, 1994 [JP] Japan ................... 6-328387
Dec. 27, 1995 [JP] Japan ................... 7-340857

[51] Int. Cl.$^6$ ........................................ B32B 9/00
[52] U.S. Cl. .................. 428/408; 428/688; 428/689; 428/697; 428/698; 428/699; 428/539.5; 428/908.8
[58] Field of Search ..................... 428/408, 688, 428/689, 697, 698, 699, 539.5, 908.8

[56] References Cited

U.S. PATENT DOCUMENTS

| 4,255,165 | 3/1981 | Dennis et al. ........... 51/309 |
| 4,783,368 | 11/1988 | Yamamoto et al. ........ 428/408 |
| 4,784,023 | 11/1988 | Dennis ................. 76/108.2 |
| 5,010,043 | 4/1991 | Ringwood ................ 501/90 |
| 5,037,704 | 8/1991 | Nakai et al. ............ 428/550 |

FOREIGN PATENT DOCUMENTS

| 50-120979 | 9/1975 | Japan. |
| 61-146793 | 7/1986 | Japan. |
| 4333266 | 6/1992 | Japan. |
| 4-245463 | 9/1992 | Japan. |

Primary Examiner—Kathleen Choi
Attorney, Agent, or Firm—Oblon, Spivak, McClelland, Maier & Neustadt, P.C.

[57] ABSTRACT

A thin film layered member having high heat dissipation efficiency is composed of at least two diamond layers and at least one interlayer. The diamond layers and the interlayer ape alternately laminated and the diamond layers form outer surfaces of the thin film layered member. When this member is applied to a heatsink or the like, thermal stress to an element mounted thereon can be reduced because of a laminated structure comprising an interlayer having a high coefficient of thermal expansion and diamond layers having a low coefficient of thermal expansion. Further, the interlayer includes a carbide forming metal, which reacts with carbon atoms constituting a diamond in a laminating process and to form a carbide at an interface between the interlayer and the diamond layer, thereby realizing strong bonding therebetween.

18 Claims, 5 Drawing Sheets

THIN FILM LAYERED MEMBER

BACKGROUND OF THE INVENTION

1. Field of the Invention

The present invention relates to a thin film layered product which may be used to make electronic heatsinks as submounts for high-power semiconductor lasers and devices.

2. Description of the Related Art

As the demands for integration, high power and high responsibility of electronic devices have increases, it has become important to drain away the heat generated by an element itself quickly to the outside so as to improve the performance of the device. A circuit substrate for electronic parts requires insulation and the technique of forming an electric conductor on the substrate is especially important. On the other hand, a heatsink for high energy output elements such as a power transistor and semiconductor laser needs a different technique of dealing with extremely high heat energy density. Especially, the heat dissipation efficiency of a heatsink is required to be as high as 100 times that of the circuit substrate. Severe electrical and mechanical properties are also required.

In some conventional devices such as a semiconductor laser element and a high frequency device, natural or artificially synthesized diamond excellent in thermal conduction is used as a heatsink (Japanese Unexamined Patent Publication (KOKAI) No. 120979/1975). A conventional heatsink, however, has the following disadvantages. There is a difficulty in processing to make a heatsink by thinning single crystal diamond; there is a limitation in the area to be used which depends on the size of the original single crystal diamond; and it is expensive.

It has also been proposed to apply to a heatsink a diamond thin film synthesized by CVD method under the low pressure as a self-standing polycrystalline film or one deposited on an appropriate material having high thermal conductivity (Japanese Unexamined Patent Publication (KOKAI) No. 146793/1986 and Japanese Unexamined Patent Publication (KOKAI) No. 245463/1992). These prior arts, however, have the following disadvantages. Compared with a coefficient of thermal expansion of a metal used for a submount or silicon used generally as a device material, a coefficient of thermal expansion of diamond is extremely small, which causes thermal deformation of the heatsink. Handling is difficult because a diamond polycrystalline film is easily cracked. A heatsink of a single film lacks reliability in insulation because a solder material may exude through a crack. Furthermore, the roughness of a surface of a CVD polycrystalline film reaches 1 to 10 μm and polishing of the surface will be needed depending on purposes, which will raise the cost.

Furthermore, it has been proposed to utilize as a heat conducting substrate a layered product in which CVD polycrystalline diamond films are bonded by organic resin or glass (Japanese Unexamined Patent Publication (KOKAI) No. 333266/1992). This publication also refers to metallic brazing and discloses a composite interlayer filled with diamond particles as adhesives to improve thermal conductivity. For a practical use as a heatsink, however, it has been found that further inventive effort is necessary to improve the insufficient heat dissipation efficiency of the layered member bonded by organic resin or glass, and to ensure enough adhesion between a layered product and an element bonded on one surface of the layered member or a heat dissipating material bonded on the other surface thereof by metallic brazing.

SUMMARY OF THE INVENTION

The present invention has been developed in view of the above-mentioned problems. It is an object of the present invention to provide a thin film layered member composed of diamond films and an interlayer, which exhibits improved heat dissipation efficiency and which is suitable for use as a heatsink or the like.

The thin film layered member of the present invention comprises at least two diamond layers and at least one interlayer of a brazing alloy containing at least one carbide forming metal, wherein the diamond layers and the interlayer are laminated alternately and the diamond layers form outer surfaces of the thin film layered member.

The present invention provides a thin film layered member suited for a practical uses as a heatsink or the like, in which: a plurality of diamond films with an interlayer therebetween are brazed with improved adhesivity; thermal stress to be applied to an element mounted thereon is reduced; heat dissipation efficiency is improved; and reliability has been increased compared with a heatsink of a single diamond layer.

Also, in the present invention, at least one of the diamond layers forming outer surfaces of the thin film layered member may have its rough growing surface used as an outer side surface. That is, the surface roughness of the outer side surface may be larger than that of the interlayer side surface. In this case, the following effects can be expected.

It is known that thermal conductivity in the in-plane direction chemical vapor deposited diamond films is higher at the growing surface side compared with that at the substrate surface side (Applied Physics Letter, vol. 60, p. 1576, 1993). Namely, at the region near the growing surface side where the surface roughness is large, heat is spread more efficiently to the in-plane direction than at the region near the substrate surface side where the surface roughness is small. That is, by selecting and combining directions of diamond films to be laminated, heat flux in the thin film layered member can be controlled so that high heat dissipation efficiency can be obtained by taking the shapes and thermal properties of an element and heat dissipating material to be mounted into consideration.

For example, when the surface area of an element to be mounted is smaller than the surface area of the thin film layered member, the growing surface of a diamond film may be used as an element side surface of the member, which will serve to spread the heat of the element quickly in the in-plane direction and thus provide improved heat dissipation efficiency of the heatsink.

In the present invention, the adhesion force between the interlayer and the diamond layer is sufficient and the separation of the layers does not occur in a practical use. On the other hand, the adhesion force between the diamond layer and a metallized layer formed as a result of bonding by solder an element or a heat dissipating material is lower as compared with the force between the interlayer and the diamond layer, and the separation may occur under specific conditions in a practical use. However, in the present invention, the adhesion force between the metallized layer and the diamond layer is improved by making the surface roughness of the element (or heat dissipating material) side surface of the diamond layer larger than that of its interlayer side surface.

Furthermore, if the surface roughness at one side of the layered member is different from that at the other side, obverse and reverse sides of a heatsink can be visually discriminated and mounting the heatsink is facilitated.

Which side of diamond films to be bonded should be determined by considering thermal properties of mounted elements and heat dissipating materials, and the thickness, thermal properties and adhesion force of bonding materials such as solder.

As a material for the interlayer, a brazing alloy containing at least one carbide forming metal which reacts with diamond is used. The carbide forming metal is selected from the group consisting of titanium, chromium, vanadium, zirconium, tantalum, niobium, hafnium, and the like. Preferably at least one of titanium, chromium and vanadium is used.

The thermal conductivity of a brazing alloy for an interlayer is preferably not less than 30 W/m·K. For example, the following two cases are compared: one case in which the thin film layered member composed of two diamond layers with thermal conductivity of 1000 W/m·K and an interlayer of a brazing alloy with a thickness ratio of 0.15 to the total thickness of the diamond films is used as a heatsink of a silicon power transistor; the other case in which a diamond single layer film having the same thickness is used as a heatsink of a silicon power transistor. In order to limit the reduction in heat dissipation efficiency of this thin film layered member to be not more than 10% relative to that of the diamond single layer film, the thermal conductivity of the brazing alloy should be not less than 28 W/m·K as shown in FIG. 1. The ordinate of FIG. 1 shows the relative heat dissipation efficiency of the thin film layered member of the present invention to the diamond single layer. Also, the abscissa of FIG. 1 shows thermal conductivity of the brazing alloy which is used as the interlayer of the thin film layered member of the present invention.

The coefficient of thermal expansion of the brazing alloy preferably falls in a range of from $10 \times 10^{-6} K^{-1}$ to $35 \times 10^{-6} K^{-1}$. The coefficient of thermal expansion is set to be not less than $10 \times 10^{-6} K^{-1}$ for the reason below. When the layered member composed of diamond layers having extremely low coefficient of thermal expansion and an interlayer of a brazing alloy is used as a heatsink for a silicon Dower transistor, more than 10% of thermal stress to be generated during mounting by solder or using mounted parts under the maximum temperature difference of 200°K. can be relieved so as to get rid of a damage in practical use. Also, the coefficient of thermal expansion is set to be not more than $35 \times 10^{-6} K^{-1}$ for the reason below. If the coefficient of thermal expansion of brazing alloy becomes more than $35 \times 10^{-6} K^{-1}$, the difference between the coefficient of diamond and that of brazing alloy becomes so large as to increase the probability that the layered member may be broken in the process of production or in the cyclic cooling and heating test under the actual use conditions. If the coefficient of thermal expansion of a brazing alloy falls in a range of from $10 \times 10^{-6} K^{-1}$ to $35 \times 10^{-6} K^{-1}$, the coefficient of thermal expansion of the whole layered member becomes relatively larger compared with that of a diamond single layer having the same thickness. As a result, thermal stress of solder for bonding a heatsink to an element or a heat dissipating material and thermal stress applied to an element itself can be reduced, thereby providing improved adhesion at soldered portions and a reliable operation of an element. These effects are prominent when the ratio (a/b) of the sum (a) of thicknesses of all interlayers to the sum (b) of thicknesses of all diamond layers is set to be $0.01 \leq (a/b) \leq 10$. More preferably, the ratio (a/b) is set to be $0.1 \leq (a/b) \leq 1$. These effects can be defined by the thickness of all interlayers and the thickness of all diamond films, each interlayer having a thickness sufficient to fill up the surface roughness of diamond films to be bonded.

The reasons why the range of thickness ratio (a/b) is set to be $0.01 \leq (a/b) \leq 10$ are as follows: If the thickness ratio (a/b) is less than 0.01, the thickness of interlayers, whose coefficient of thermal expansion is relatively larger than that of diamond films, is thin so that it is hard to obtain the above-mentioned effects given by increasing the coefficient of thermal expansion of the thin film layered member as a whole compared with that of the diamond single layer. On the other hand, if the thickness ratio (a/b) is larger than 10, the heat dissipation efficiency of the thin film layered product as a heatsink is reduced due to the interlayers having lower thermal conductivity than that of diamond films and the intended purpose is not satisfied.

Thus, the thin film layered member of the present invention can be utilized as a heatsink of high performance.

In the present invention, the carbide forming metal included in the interlayered brazing alloy reacts with carbon atoms constituting diamond in the brazing process and a carbide is formed at an interface between the diamond layer and the interlayer, thereby attaining strong adhesion between the diamond layer and the interlayered brazing alloy. As a result, notwithstanding the considerably large difference in a coefficient of thermal expansion between diamond and an interlayered brazing alloy, the thin layered member can maintain its layered structure without peeling off or breaking, even under any temperature change in the process of production from the brazing temperature to room temperature, in the process of soldering an element for use, and also in the practical use. So the thin film layered structure of the present invention gives the following functions.

Owing to the thin film layered structure in which an interlayer having a high coefficient of thermal expansion is interposed between diamond films having a low coefficient of thermal expansion, for example when it is used as a heatsink, the present invention can reduce thermal stress generated at the element or solder compared with that of the conventional heatsink of a diamond single layer.

Depending on its purpose and application, growing surfaces of two diamond films may be used as the interlayer side surfaces, and smooth surfaces thereof (i.e. substrate side surfaces) may be used as the outer side surfaces, which will obviate polishing of the surfaces.

Also, by using two or more diamond films, the reliability in insulation of the thin film layered member can be improved.

Furthermore, depending on purpose and application, the growing surface or surface having larger surface roughness of at least one of the two diamond films may be used as its outer side surface, so that the heat dissipation efficiency of a heatsink or the like can be improved or the adhesion between the metallized surface layer and a bonding materials such as solders can be improved.

As mentioned above, when the growing surfaces are used outer side surfaces of the layered member, crystallites constituting films at the growing surface side are larger and the grain boundaries are less than those at the substrate side of diamond films. Accordingly, the thermal conductivity toward the in plane direction becomes higher when the growing surface side is directed toward the heat source, and the heat dissipation characteristics of a heatsink can be improved.

In the present thin film layered product, the brittleness of diamond films is reinforced by forming it in a layered structure and handling in surface metallizing or mounting is facilitated.

Moreover, by interposing a metal layer having large heat capacity between diamond layers, when the thin film layered product is used as a heatsink, heat capacity of the whole heatsink is increased and heat accumulating effect to the transient thermal load is exhibited, thereby improving the heat dissipation effect especially when the thermal load is applied pulsatively.

BRIEF DESCRIPTION OF THE DRAWINGS

Other objects, features and advantages of the invention will be readily understood by reference to the following detailed description when considered in connection with the accompanying drawings.

DETAILED DESCRIPTION OF THE PREFERRED EMBODIMENTS

Figure 1:
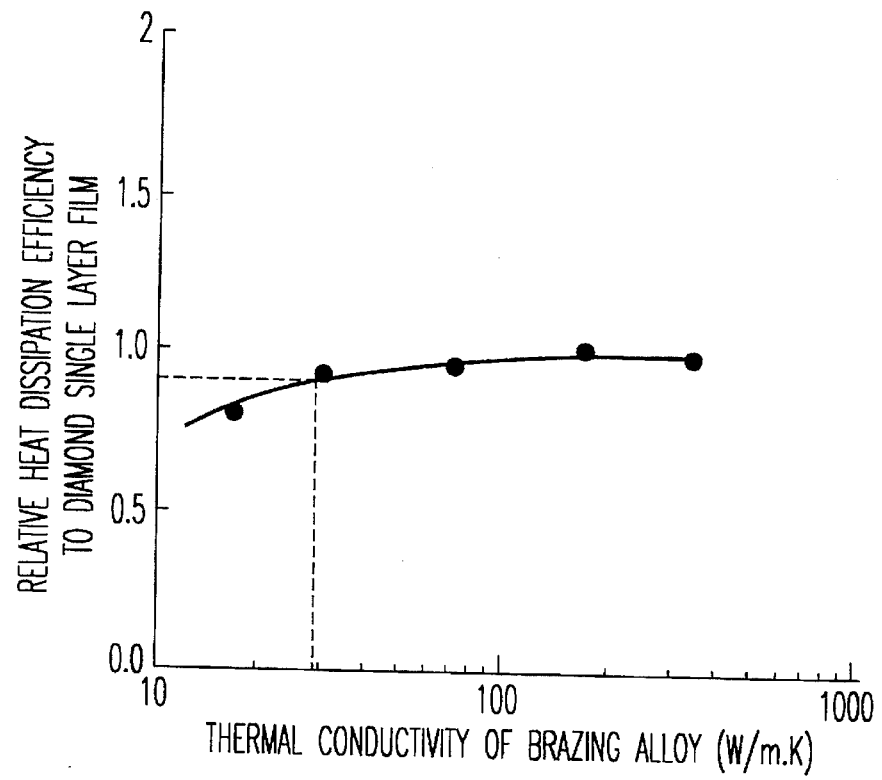
FIG. 1 is a graph showing a relative heat dissipation efficiency of the thin film layered member of the present invention to a diamond single layer film as a function of thermal conductivity of a brazing metal.

The method for producing diamond films used in the present invention is not particularly limited. For example, it is possible to use self-standing films produced by a substrate stabilized flat flame method using acetylene/oxygen (combustion flame method) (Combustion and Flame, vol. 91, p. 239, 1992), or an RF induction thermal plasma method (Diamond and Related Materials, vol. 2, p. 612, 1993). The diamond film may be obtained as a self-standing film by depositing diamond on a molybdenum or silicon substrate and then naturally peeling off a diamond film or removing the substrate by polished or by chemical etching.

The diamond film obtained by a chemical vapor deposition is usually a polycrystalline film and its surface roughness is large because a crystal habit surface of a diamond crystal appears on the growth surface. The surface roughness of this growth surface becomes larger as the quality of the diamond film becomes higher and the film thickness becomes larger. Since a substrate side surface of the diamond film replicates the surface shape of the substrate, a smooth, substrate side surface of the diamond film can be obtained by using a substrate with a smooth surface. Therefore, a thin film layered member with both surfaces thereof being smooth can be easily obtained, without further processing such as polishing, by using these smooth substrate side surfaces as outer surfaces of the thin film layered member.

It is not always necessary to use self-standing films. It is also possible to use films as they are deposited on the substrates, these substrates may be separated, polished or removed by etching after the diamond films are bonded through an interlayer. Films on the substrates have an advantage over self-standing films in that handling in bonding films is facilitated with such substrates being on the outermost sides.

The number of layers may be increased by alternately laminating: two diamond layers and one interlayer; three diamond layers and two interlayers; four diamond layers and three interlayers; and so on.

Examples of brazing alloys of high thermal conductivity for an interlayer include: a Ag—Cu brazing alloy, in form of foil, sheet or paste, containing Ti; and a brazing alloy containing Cr and V, for example, Cu—Ga—Cr or Cu—Ga—V brazing alloy in form of foil, sheet or paste.

A brazing alloy may be selected from the group consisting of tin, silver, copper, gold, lead and the like; an alloy of at least one of tin, silver, copper, gold, lead and the like; copper-gallium; and copper-tin. Indium, aluminium or silicon may be added in addition to the above-mentioned metals.

The content of a carbide forming metal in a brazing alloy ranges from 0.01 to 20% and preferably ranges from 0.1 to 10% by weight with respect to the brazing alloy.

Prior to brazing, the whole or a part of necessary amount of a carbide forming metal to provide sufficient adhesion may be applied to the surface by vacuum deposition or plating, followed by brazing using a brazing alloy not including or including a small amount of a carbide forming metal. Brazing may be carried out by using a brazing alloy foil (not including or including a small amount of a carbide forming metal) on both surfaces of which is deposited a carbide forming metal.

Also, diamond films metallized by Ti/Au may be bonded under thermal compression. Otherwise, diamond films metallized by Ti/Pt/Au or Ti/Ni may be soldered.

Instead of forming a member by interposing a brazing alloy containing a carbide forming metal between diamond films, diamond films may be deposited on both surfaces of a metal sheet including a carbide forming metal to form a layered member as a result.

Figure 2:
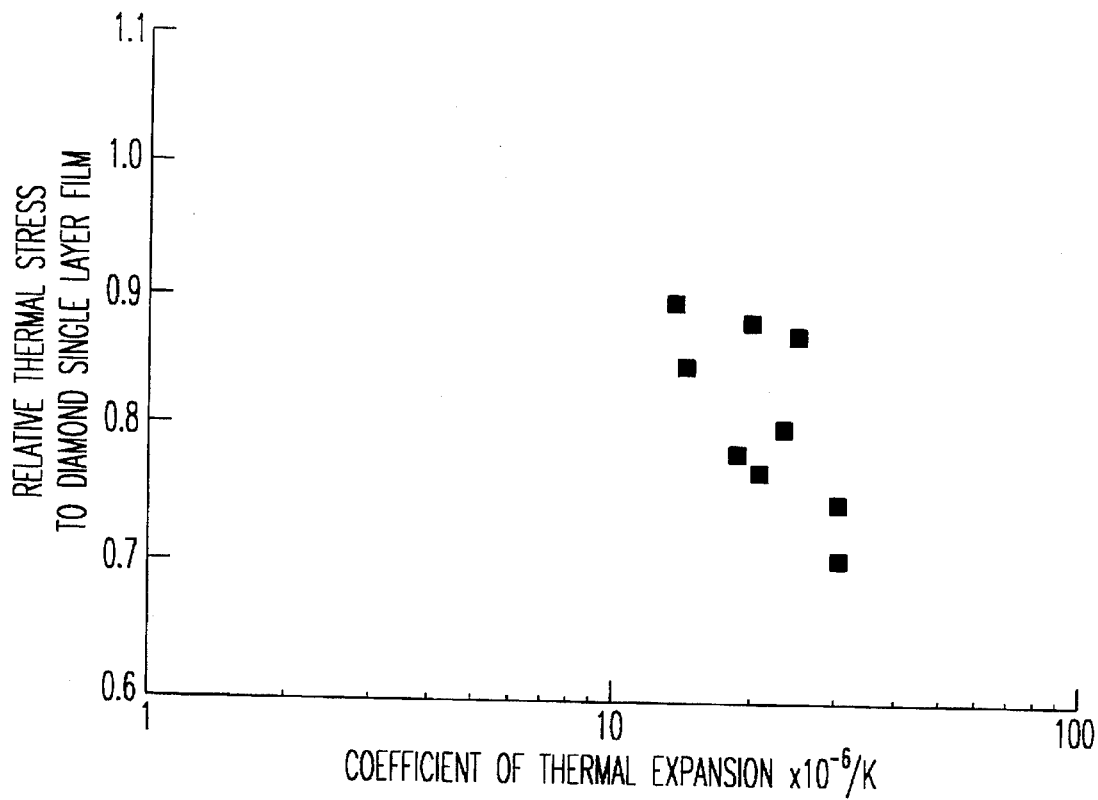
FIG. 2 is a graph showing a relative thermal stress of the thin film layered product of the present invention to a diamond single layer film as a function of thermal conductivity of a brazing metal.

FIG. 2 shows a comparison in thermal stress between the diamond single layer and the thin film layered members using brazing alloys with different coefficients of thermal expansion as interlayers, both of which were used as heatsinks of silicon power transistors. FIG. 2 shows the relative thermal stress of the thin film layered member to the diamond single layer as ordinate and shows coefficients of thermal expansion of the interlayers as abscissa. The ratio (a/b) of the thickness of an interlayer to the thickness of all diamond films in the thin film layered member was set to be 0.5 and the comparison was made as to the maximum thermal stresses generated at the element due to the temperature difference (200° C.) under the cooling and heating conditions in practical use.

In the present invention, by using the brazing alloy having specified coefficients of thermal expansion, the thermal stress could be reduced more than 10% as compared with the diamond single layer.

The Young's modulus is required to be not less than 30 GPa for the reason below. The coefficient of thermal expansion of diamond is about $1 \times 10^{-6} K^{-1}$ and the brazing alloy for the interlayer has the coefficient of thermal expansion ranging from 10 to $30 \times 10^{-6} K^{-1}$. If the Young's modulus of the brazing alloy is too small, when the temperature rises, it is not possible to increase the apparent coefficient of thermal expansion of the layered member to bring the coefficient of thermal expansion to that of semiconductor elements such as Si and GaAs.

Having generally described the present invention, a further understanding can be obtained by reference to the specific preferred embodiments which are provided herein for purposes of illustration only and are not intended to limit the scope of the appended claims.

First Preferred Embodiment.

Figure 3:
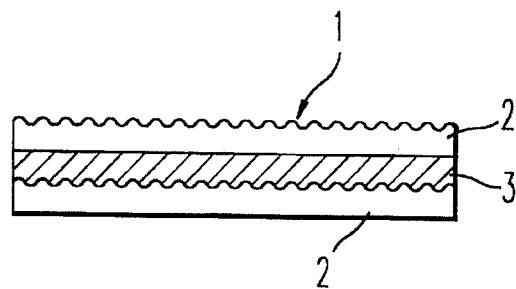
FIG. 3 is a cross-sectional view showing the lamination state of a thin film layered product of a First Preferred Embodiment of the present invention.

FIG. 3 shows a thin film layered product of a First Preferred Embodiment of the present invention. This thin film layered product 1 comprises diamond films 2 and an interlayer 3 which intervenes between these diamond films 2. These diamond films 2 are produced as follows.

A diamond film was formed by a substrate stabilized flat flame method, in which method acetylene-oxygen-hydrogen mixed gas whose acetylene molecule/oxygen molecule/hydrogen molecule ratios fall in ranges of 1.01/1.00/0.50 are used as reactant gas. Film deposition was conducted for 2.0 hours, using Mo (rod whose diameter is 15 mm) as a substrate. After the deposition of films, the diamond film was peeled off during cooling of the substrate, a disc-shaped self-standing film of 40 μm thickness and 15 mm diameter was obtained. In the First Preferred Embodiment, two sheets of self-standing films of 40 μm thickness obtained by the same method were used as diamond films 2.

As the interlayer 2, silver braze (an activated brazing alloy CUSIL-ABA produced by WESGO Company) (composition: 63% Ag-35.25% Cu-1.75% Ti) with high thermal conductivity including Ti as a carbide forming metal was used. This brazing alloy has the following physical properties: thermal conductivity is 180 W/m·K; and coefficient of thermal expansion is $18.5 \times 10^{-6} K^{-1}$ (at room temperature ~500° C.). The brazing alloy intervened between two sheets of diamond films 2 was put into a vacuum furnace, and a load was mounted thereon. After reducing the pressure of the vacuum furnace to less than $10^{-5}$ Torr, of temperature was raised and kept at 840° C. for ten minutes so that the brazing was conducted. Thus, as a whole, the thin film layered product 1 of 120 μm in thickness, was obtained.

The above-mentioned brazing was conducted in the vacuum. However, the brazing may be conducted by heating in inactive gases such as argon or helium. The heating method may be resistance heating or radio frequency heating which may not affect the atmosphere during brazing.

While brazing, both of two sheets of diamond films were laminated, putting growing surfaces of diamonds in the same direction. This is because the crystallites on the growing surface side of diamond films are larger than those on the substrate side of diamond films and grain boundaries at the growing surface sides are less than those at the substrate sides so that the thermal conductivity in the in-plane direction of the film is higher. Accordingly, if an element which dissipates heat is mounted on the higher coefficient of thermal conductivity side of a heatsink using the film layered member 1, heat can be diffused toward the in-plane direction (the direction which is perpendicular to the thickness) more efficiently so that the heat dissipation characteristics of the heatsink as a whole can be improved.

Otherwise, diamond films 2 are laminated so as to locate their growing surfaces on the surface sides in brazing. The crystallites at the growing surface sides of diamond films are larger than the crystallites at the substrate side of diamond films so that it is possible to form surfaces having higher thermal conductivity on the surface of the product. Bonding growing surface having high thermal conductivity with the element gives the effects of rapid absorption and dissipation of the thermal energy generated by the element. Accordingly, the same effects of heat dissipation characteristics and thermal stress of a heatsink as a whole can be obtained as in the above-mentioned construction.

Instead of the above-mentioned Ag—Cu—Ti brazing alloy, Cu—Ga—Cr (composition: 80.3% Cu-18.6% Ga-1.1% Cr) brazing alloy or Cu—Ga—V (composition: 80.3% Cu-18.6% Ga-1.1% V) brazing alloy can be used, the thin film layered product having same performance as that of the present invention can be obtained.

By using a silver braze (a silver braze Cusil produced by WESCO Company) (composition: 72% Ag-28% Cu), without a carbide forming metal five sets were brazed. Even though the brazing alloy was sufficiently melted, a whole of or a part of diamond films were not bonded and that portions turned to be white in all five sets of products. These portions were easily peeled off from the diamond films by applying slight force. In the case of the First preferred Embodiment, TiC formed at the boundary between a brazing alloy and diamond films (and observed to be black through diamond films) serves to bind them strongly and failure of bonding rarely occurs.

Second Preferred Embodiment

According to the same method of the First Preferred Embodiment, the thin film layered product 1 of the Second Preferred Embodiment comprising diamond films 2 and the interlayer 3 therebetween, whose construction is shown in FIG. 1, was obtained. As the diamond film 2 which is at the upper side of the thin film layered product of the Second Preferred Embodiment, a self-standing film of 33 μm thickness was used. It was obtained by using acetylene-oxygen-hydrogen mixed gas whose acetylene molecule/oxygen molecule/hydrogen molecule ratios fall in ranges of 1.01/1.00/0.50 in the same way as that of the First Preferred Embodiment and by forming the film for 1.7 hours. As the diamond film 2 at the lower side thereof, a self-standing film of 35 μm thickness was used. It was obtained by using acetylene-oxygen-hydrogen mixed gas whose acetylene molecule/oxygen molecule/hydrogen molecule ratios fall in ranges of 1.04/1.00/0.50 and by forming the film for 1.5 hours. The brazing was conducted in the same way as that of the first Preferred Embodiment. Thus, as a whole, the thin film layered product 1 of 110 μm in thickness was obtained.

Figure 4:
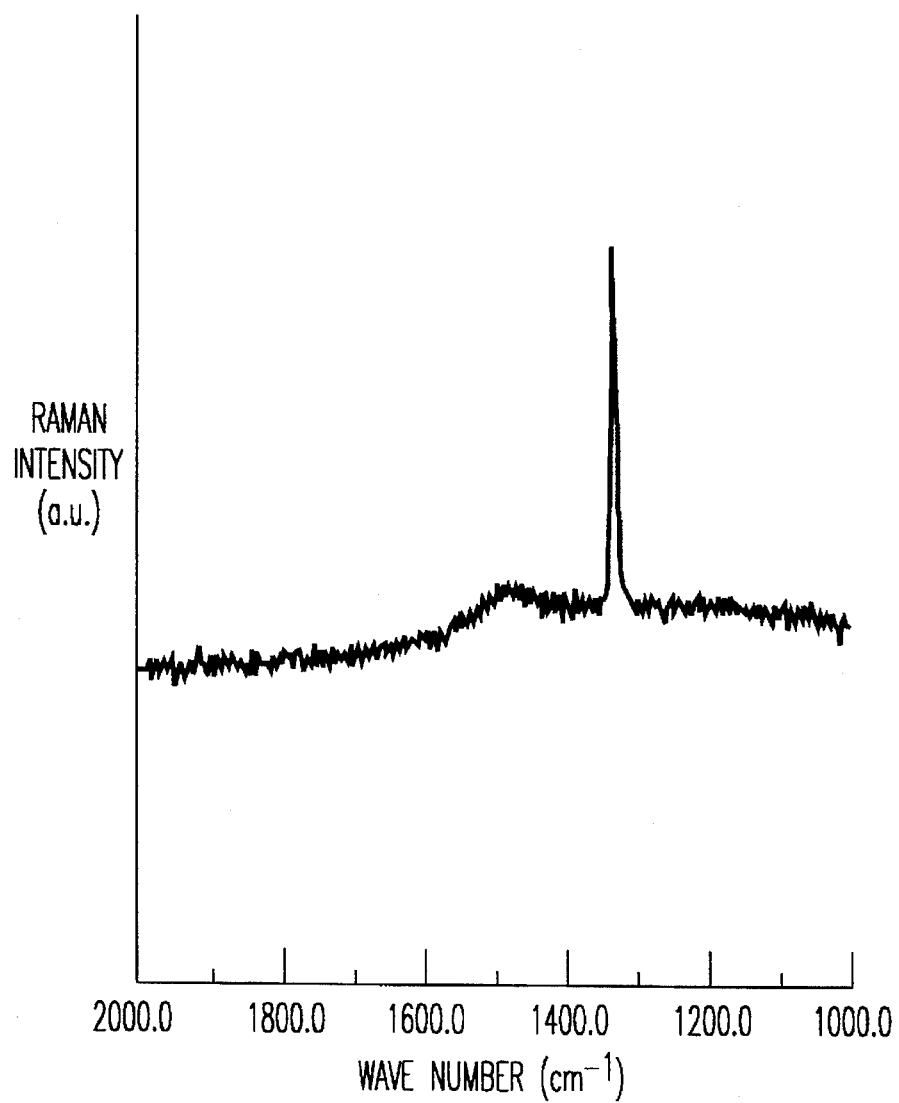
FIG. 4 shows the Raman spectrum of diamond of the thin film layered product of the First Preferred Embodiment.

The film Quality and the stress of the diamond films 2 composing the thin film layered product 1 of the Second preferred Embodiment were evaluated by using Raman spectroscopy. Raman spectrum was measured by using Raman spectroscopy system made by Japan Spectroscopic Co., Ltd. RPM-1000 type, excited light: Ar laser (488 nm), 200 mW; beam diameter: 80 μm. Raman spectrum measured from the upper layer side of this thin film layered product 1 is shown in FIG. 4.

This thin film layered product 1 has the structure in which the interlayer 3 formed by silver brazing alloy bonds diamond films 2 together so that the Ar laser beam of the exited light does not reach the diamond film of the lower layer, not permeating through the interlayer 3 including silver braze. Accordingly, the Raman spectrum in FIG. 4 is obtained only from the diamond film 2 at the upper layer. In the Raman spectrum in FIG. 4, a broad peak caused by the non-diamond components was slightly observed near 1500 cm$^{-1}$. However, it is quite weak compared with the strong and sharp diamond peak observed from 1334 cm$^{-1}$ to 1337 cm$^{-1}$. Therefore, it is found that the diamond film has high purity including very little non-diamond components. The position of the Raman peak of diamond is slightly shifted from the state of no stress (1333 cm$^{-1}$) to the higher wave number side. It can be found that there exists slight thermal stress caused by the thermal expansion difference between the brazing alloy and the diamond films because the brazing is conducted in high temperature.

The linear thermal expansion coefficient of the brazing alloy used is 18.5×10$^{-6}$ (at room temperature ~500° C.) and it is extremely larger than that of diamond (1×10$^{-6}$ at room temperature). The solid phase point of the brazing alloy is 780° C. Therefore, if the cooling is conducted until room temperature after brazing, thermal stress (compressive stress) which corresponds to the temperature difference of about 750° C. affects the diamond films so that the Raman peak of diamond must be shifted to the high wave number side. Even in the construction of the Second Preferred Embodiment in which the film 3 including silver braze is sandwiched, there exist slight compressive stress in the diamond films 2.

As mentioned above, during laminating thin films having quite different thermal expansion coefficients, there arises stress. However, diamond film 2 is bonded to not only the one side of film 3 including silver braze but also both surfaces thereof so that little deformation (warp) of the laminated films is found, which is also the characteristics of the structure of the Second Preferred Embodiment.

Third Preferred Embodiment

The object of the Third Preferred Embodiment is to observe the thermal stress which affects on the element mounted on the thin film layered product of the present invention. In the same method as the Second Preferred Embodiment, the thin film layered product of the Third Preferred Embodiment was obtained by diamond films having a thickness of 100 μm and the interlayer comprising the brazing alloy whose thickness is 50 μm and which intervenes between these diamond films.

The surface of the diamond films of this thin film layered product was treated in metallization by Ti/Ni. After that, a silicon semiconductor device was soldered on the metallized layer. The thermal stress caused by the temperature difference (about 200° C.) generated during soldering was evaluated by the shift of the Raman peak position of silicon using Raman spectral method.

As a comparative example, a single crystal diamond and polycrystalline diamond plates having the same thickness of 240 μm were prepared and the surface of the diamond films were similarly treated in metallization by Ti/Ni, and then, the silicon semiconductor device was soldered on the metallized layer.

As a result, in the case of the thin film layered product of the present invention, compared with the substrate comprising the single crystal diamond and diamond single layer of polycrystalline diamond plate, it was found that the thermal stress is reduced by 15%.

Furthermore, the thin film layered product of the Third Preferred Embodiment and the substrate with a diamond single layer used as the comparative example, were similarly metallized, a silicon power transistor was mounted thereon and a thermal endurance test was conducted at the temperature ranging from −40° C. to +150° C. for 2000 times. After that, the operating characteristics of the silicon power transistors were evaluated.

As a result, in the transistor mounted on the thin film layered product of the Third Preferred Embodiment of the present invention, characteristic degradation was not found. In the comparative example, however, about 40% of characteristic degradation product was found. When the soldered portions of these degradation products were examined, some cracks were found in the jointed portions. This is because that solder distortion amount is larger in the comparative example, than that of the present invention.

Fourth Preferred Embodiment

Figure 5:
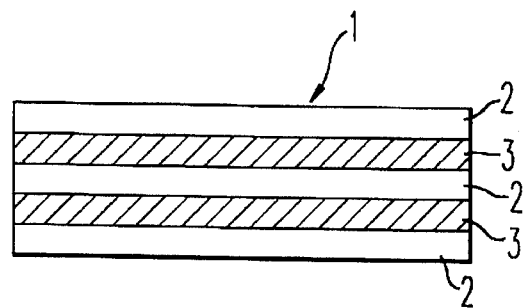
FIG. 5 is a cross-sectional view showing a lamination state of the thin film layered product of a Fourth Preferred Embodiment.

The thin film layered product of the Fourth Preferred Embodiment of the present invention is shown in FIG. 5. This thin film layered member comprises three sheets of diamond film 2 and two sheets of the interlayer 3 which intervenes among these diamond films 2.

These diamond films were formed by a substrate stabilized flat flame method (combustion flame method) in which acetylene/oxygen/hydrogen as reactant gas and molybdenum substrate were used. Namely, a diamond self-standing film which was deposited on the molybdenum substrate and naturally peeled off during cooling after deposition of film was used as diamond films 2. These diamond films 2 have the thicknesses of 40 μm.

As the interlayer 3, Ag—Cu brazing alloy foil (composition: 63% Ag-35.25% Cu-1.75% Ti) including Ti of 50 μm thickness a carbide forming metal was used. These two sheets of brazing alloy foils were alternately sandwiched among three sheets of these diamond self-standing film and then they were brazed under vacuum.

The whole thickness of the thin film layered product 1 of the Fourth Preferred Embodiment was 200 μm.

Figure 6:
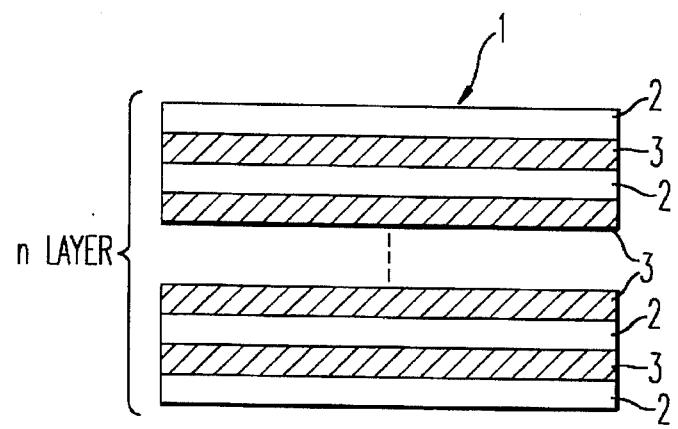
FIG. 6 is a cross-sectional view showing a lamination state of the thin film layered product having a multi-layer structure of the present invention.

By using the methods in the First Preferred Embodiment and the Fourth Preferred Embodiment, the thin film layered product 1 of n layer can be formed as shown in FIG. 6. In the methods described in the First, Second and Third Preferred Embodiments, self-standing films were used as diamond films 2. However, diamond films bonded integrally to the substrate can be used. In this case, after brazing the interlayer 3 and the diamond films bonded integrally to the substrate, it is necessary to remove the substrate. This removal can be achieved by methods such as separation, polishing or etching.

Fifth Preferred Embodiment

By using the same method of the First Preferred Embodiment, the thin film layered product of the Fifth Preferred Embodiment, which comprises two sheets of diamond films and the interlayer intervened therebetween, was obtained. The growing surface of one of two sheets of diamond films was used as an outer surface of the layered member so that the surface roughness is relatively larger at one surface of the layered member than at the other surface thereof. For comparison, the followings were prepared: the thin film layered product in which substrate side surfaces (having smaller surface roughness) of both of two sheets of diamond films were used as both outer surfaces of the thin film layered member; and also a single polycrystalline diamond plate of the same thickness as that of these thin film layered member. The surfaces having different surface roughness of these two kinds of thin film layered products and the substrate surface side of the polycrystalline diamond plate were metallized by Ti/Ni. Furthermore, assuming an element having a relatively large coefficient of thermal expansion, a Ni plated molybdenum chip was soldered thereon and the thermal endurance test was conducted as in the Third Preferred Embodiment.

As the result, in the thin film layered product of the present invention, there was not found any trouble such as separation of metallized layer in the product in which molybdenum chip was soldered on its growing surface having large surface roughness. However, in the product in which molybdenum chip was soldered on the substrate surface side having small surface roughness, the partial or whole separation of the metallized layer occurred on about 30% of all tested pieces. And in the product in which molybdenum chip was soldered on the substrate surface side of a single polycrystalline diamond plate having the same small surface roughness as that of the above-mentioned example, the partial or whole separation if the metallized layer occurred on about 60% of all tested pieces was found. It is assumed that this is because the coefficient thermal expansion of the thin film layered product is larger than that of the diamond single layer and that the product having large surface roughness has stronger adhesivity to the metallized layer.

Sixth Preferred Embodiment

Diamond was deposited on molybdenum substrate with a mirror finished surface and the brazing alloy (50 µm) was interposed between two sheets of diamond films (thickness is 100 µm), which were obtained by removing the substrate, so that the thin film layered member was produced in the same way as in the First Preferred Embodiment. At this time, the growing surfaces of diamond films were bonded, and the surfaces of the thin film layered member were formed of the substrate side surfaces of the diamond films. Accordingly, the surface of the Sixth Preferred Embodiment is a replica of the smooth mirror finished surface of the substrate. This surface roughness of this thin film layered product was measured, and it was found as follows: Ra=8 nm which is small enough and it is not necessary to conduct processing such as polishing the surface thereof when the thin film layered member is used as a high performance heat sink.

On the other hand, in the case of a polycrystalline diamond single layer (200 µm) which was produced by chemical vapor deposition. The surface roughness of the diamond growing surfaces was more than Ra=900 nm and it was necessary to polish the surface thereof in order to use it as a high performance heat sink.

Seventh Preferred Embodiment

A thin film layered product for a thin and long heatsink was produced as a large size submounts of reduced heat resistance. The shape of this thin film layered product is 8 mm×8 mm and its thickness is 80 µm. Namely, after brazing two sheets of diamond films having thickness of 30 µm, they were brazed by the brazing alloy having thickness of 20 µm. In the product of the Seventh Preferred Embodiment, even though the diamond films were thin, they were reinforced by metal films of brazing alloy and the bending strength was improved, so that it was not destroyed during usual handling. On the other hand, in the case of a diamond single layer whose thickness is 80 µm, its bending strength was insufficient and there arose some breakage or crack. Therefore, it is necessary to pay close attention to handle it, resulting in poor working efficiency.

After both surfaces of each of twenty products of the Seventh Preferred Embodiment and each of twenty comparative examples of diamond single layer were metallized, silicons were soldered in the same way as in the First Preferred Embodiment and the thermal resistance test was conducted as in the Second Preferred Embodiment. After that, electric probes were inserted at both metallized portions and the dielectric withstanding test was conducted.

As a result, nineteen pieces of products of the present invention showed the predetermined dielectric withstanding voltage and only one piece showed defective whose dielectric properties. On the other hand, in the comparative examples, dielectric property of six pieces were greatly reduced. As the result of examining defectives precisely, there was found some evidence of discharge or condition at the slightly cracked portion in the films. As mentioned above, this shows that the insulation reliability of the product of the Eighth Preferred Embodiment is high.

Function as Heat Sink

In order to examine the function of the thin film layered product of the present invention as a heatsink, the thin film layered produces of the above-mentioned First and Second Preferred Embodiments were used as heatsinks.

For measuring the heat dissipation characteristics, it is necessary to solder a base metal and a heating element each other. At this time, in order to wet the solder enough to improve it's adhesion, Ni/Ti was metallized on the diamond surfaces by using an electron beam deposition method.

Figure 7:
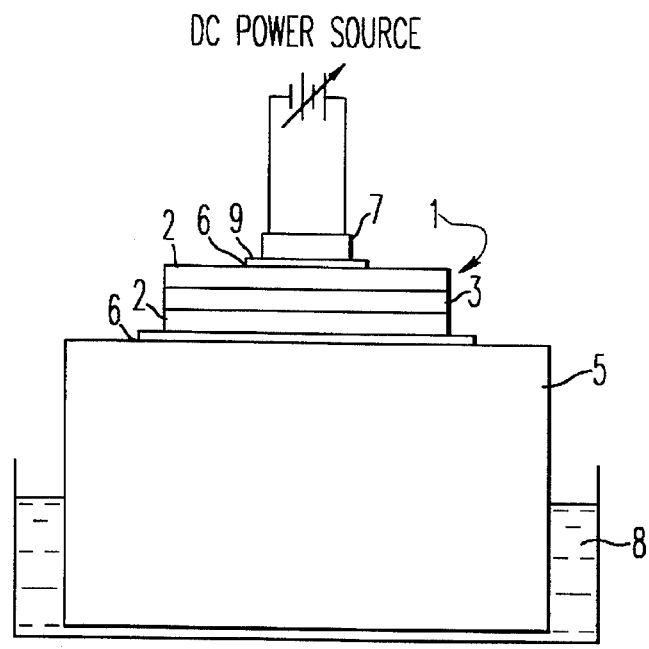
FIG. 7 is a cross-sectional view of a test equipment for examining a heat dissipation characteristics when the thin film layered member is used as a heatsink.

After that, as shown in FIG. 7, the thin film layered product 1 was soldered on a Al base 5 by using solder 6 and furthermore on top of that, by using a solder 6, a micro-heater 7, in which platinum was patterned on the surface of alumina substrate (3×4 mm$^2$) and from which a platinum lead wire was bonded, was soldered on the thin film layered product 1. The platinum lead wire of this micro-heater 7 was connected to the DC power source. The heat dissipation characteristics was measured by using natural air cooling and, by a method of dipping Al base 5 in a water bath 8 as shown in FIG. 7.

In the test, dc voltage was applied to the micro-heater 7 to heat the micro-heater 7. The rising of temperature at the upper surface of the thin film layered product 1 used as a heatsink was measured by a thermo couple 9 soldered to the metallizing portion of diamond near the heater 7. The temperature distribution near the thin film layered product 1 was measured by a thermo viewer (JTG-4600S) made by Japan Electron Co., Ltd. after spray-painted for correcting emissivity.

Figure 8:
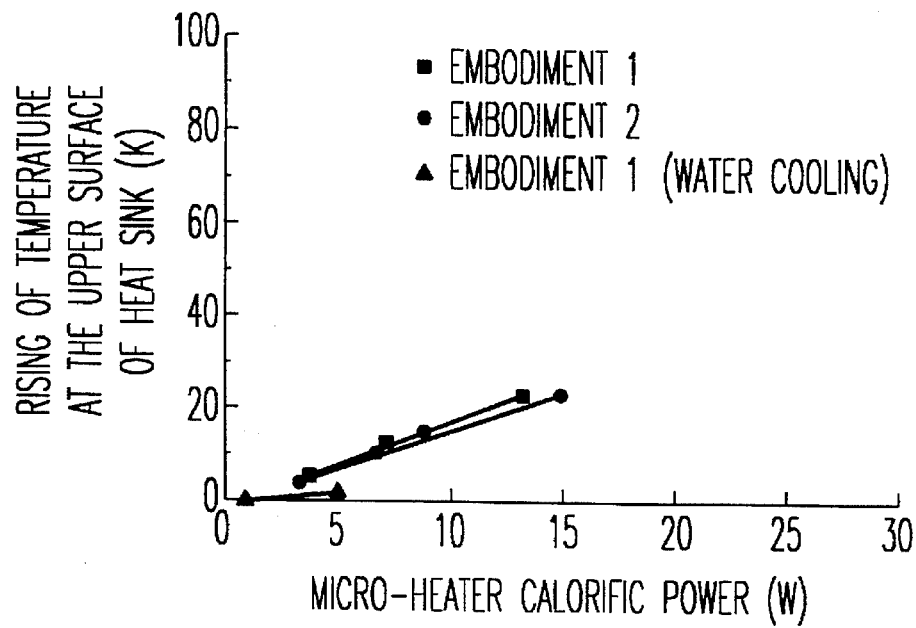
FIG. 8 is a graph showing a relationship between microheater calorific power rising of temperature at the upper surface of a heatsink when the thin film layered member of the First and Second Preferred Embodiments are used as heatsinks.

In the cases of thin film layered products of the First and Second Preferred Embodiments, FIG. 8 shows the relationship between calorific power of micro-heater and rising of temperature at the upper surface of the heat sink, showing the calorific power of the micro-heater as abscissa and showing the rising of temperature at the upper surface of the heat sink as ordinate.

Figure 9:
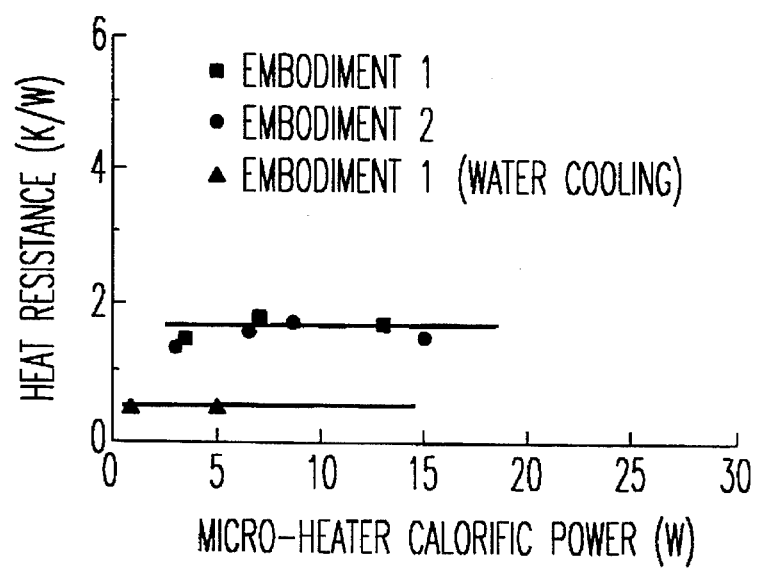
FIG. 9 is a graph showing a relationship between microheater calorific power and heat resistance when the thin film layered products of the First and Second Preferred Embodiments are used as heatsinks.

FIG. 9 shows the relationship between calorific power of micro-heater and the heat resistance, showing the calorific power of the micro-heater as abscissa and showing the heat resistance as ordinate. The gradient of the straight line shown in FIG. 8 corresponds to that of FIG. 9 so that it is found that as the gradient of FIG. 8 or the heat resistance of FIG. 9 is smaller, the heat dissipation characteristic is higher.

Even when the base is air-cooled, the satisfactory heat dissipation characteristic was obtained. Furthermore, when the heat dissipation characteristic was measured during water-cooling of the base, the rising of temperature at the upper surface of the heat sink of the First and the Second Preferred Embodiment was extremely small even if electric power was inputted to the micro-heater. As mentioned above, it can be found that the heat dissipation characteristic is extremely high if the base is water-cooled.

When the temperature distribution of the heat sink was measured by thermo viewer, it could be confirmed that the heat is effectively diffused to the whole of heat sink.

COMPARATIVE EXAMPLE

As a comparative example, diamond films was deposited on the Mo substrate of 14 mm square and 0.5 mm thickness by using a RF induction thermal plasma generator (made by Denki Kogyo Co., Ltd.). In order to remove the surface oxide and to increase the nucleation density and also to improve the adhesion between the substrate and the film, the substrate was polished by sand paper of # 700 and then by diamond paste which includes diamond abrasive of 15 μm in diameter. The diamond deposition conditions were as follows. RF output: 17 kw; gas flow rate: plasma gas Ar 2 slm (standard liter per minute), sheath gas AP 84 slm, reactant gas methane 1 slm, hydrogen 20 slm (methane/hydrogen= 5%); pressure: 120 Torr; substrate temperature: 940° C.; deposition time: 2.5 hours. Under these conditions, a sample diamond film of 33 μm thickness (Comparative Example 1) was produced. Another sample diamond film of 18 μm thickness (Comparative Example 2) was produced under the same conditions as those of the First Preferred Embodiment but at the substrate temperature of 860° C.

Figure 10:
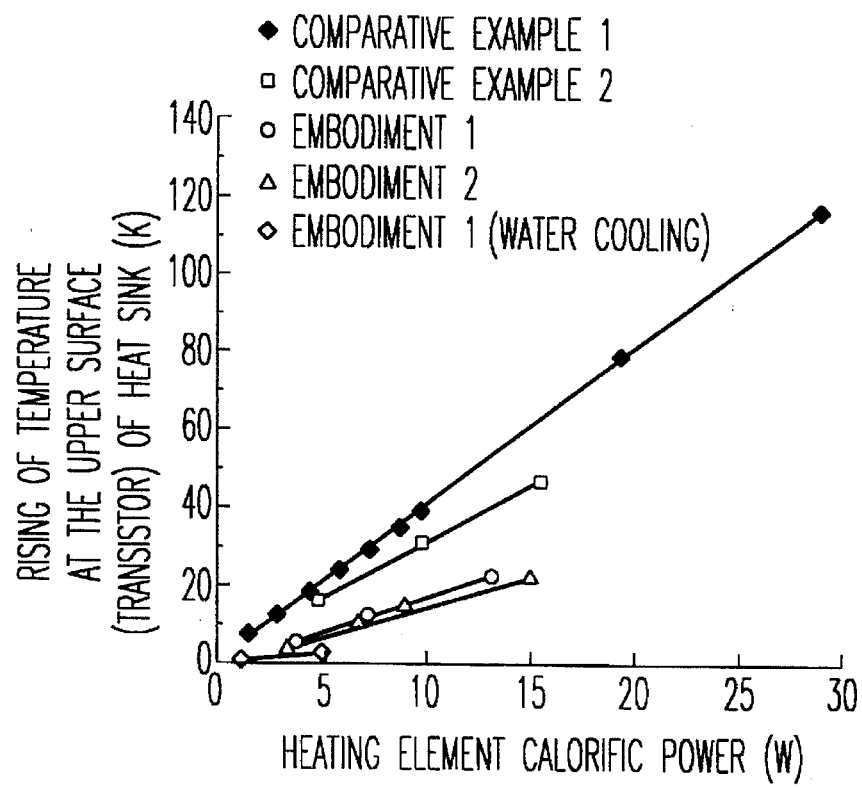
FIG. 10 is a graph showing a relationship between heating element calorific power and rising of temperature at the upper surface of a heatsink in the First and Second Preferred Embodiments and Comparative Examples 1 and 2.
Figure 11:
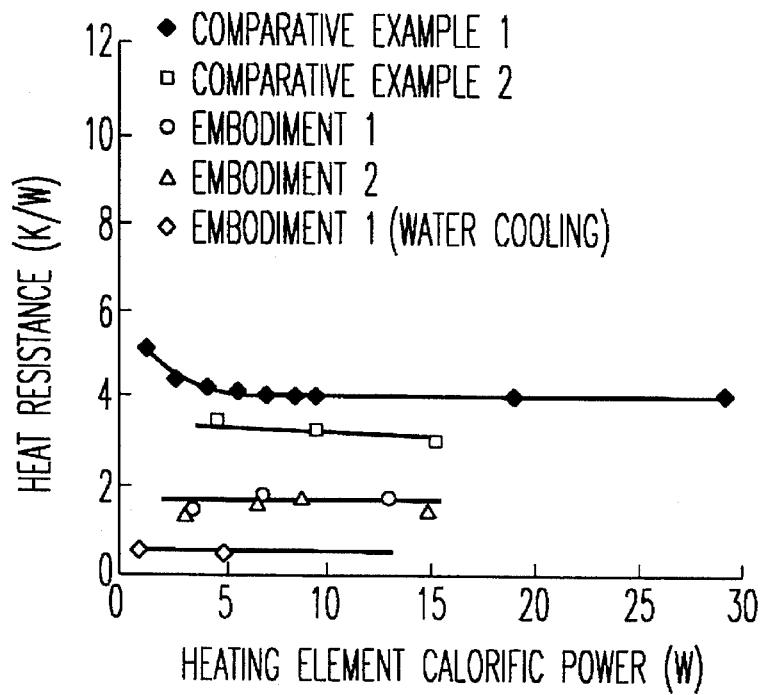
FIG. 11 is a graph showing a relationship between heating element calorific power and heat resistance in the First and Second Preferred Embodiments and Comparative Examples 1 and 2.

The comparisons among two samples of two comparative examples and the present First and Second Preferred Embodiments are shown in FIG. 10 and 11. FIG. 10 shows the relations between the heating element calorific power and the rising of temperature at the upper surface of the heat sink concerning them and FIG. 11 shows the relations between the heating element calorific power and the heat resistance concerning them.

FIGS. 10 and 11 show that the rising of temperature and heat resistance of the heatsink with the thin film layered member of the present invention are less, compared with those of the comparative examples in which a single layer of diamond film is deposited on the metal substrate. Here, a micro-heater was used as the heating element. However, even if a silicon power transistor or semiconductor laser may be used as the heating element, the same result is obtained.

Having now fully described the present invention, it will be apparent to one of ordinary skill in the art that many changes and modifications can be made there to without departing from the spirit or scope of the present invention as set forth herein including the appended claims.

We claim:

1. A thin film-layered member, comprising at least two diamond layers and at least one interlayer of a brazing alloy containing at least one carbide-forming metal, said at least two diamond layers and said at least one interlayer being laminated alternately and said diamond layers forming outer surfaces of said thin film layered member, wherein said brazing alloy has a thermal conductivity of not less than about 30 W/(m·K) and a coefficient of thermal expansion ranging from $10 \times 10^{-6}$ K$^{-1}$ to 35 to $10^{-6}$ K$^{-1}$.

2. The thin film-layered member of claim 1, wherein said carbide-forming metal is selected from the group consisting of titanium, chromium, vanadium, zirconium, tantalum, niobium and hafnium.

3. The thin film-layered member of claim 2, wherein said carbide-forming metal is selected from the group consisting of titanium, chromium and vanadium.

4. The thin film-layered member of claim 1, wherein a ratio (a/b) of the sum (a) of thicknesses of said at least one interlayer to the sum (b) of thicknesses of said at least two diamond layers is $0.1 \leq (a/b) \leq 10$.

5. The thin film-layered member of claim 4, wherein the ratio (a/b) is $0.1 \leq (a/b) \leq 1$.

6. The thin film-layered member of claim 1, wherein said brazing alloy is selected from the group consisting of alloys of tin, silver, copper, gold and lead.

7. The thin film-layered member of claim 1, wherein said carbide-forming metal is present in an amount of from about 0.01 to 20% relative to the amount of brazing alloy used.

8. The thin film-layered member of claim 6, wherein said brazing alloy is Ag—Cu—Ti, Cu—Ga—Cr or Cu—Ga—V brazing alloys.

9. The thin film-layered member of claim 1, wherein said thin film-layered member has a thickness of from about 1 to 200 μm.

10. A thin film-layered member, comprising at least two diamond layers and at least one interlayer, said at least two diamond layers and said at least one interlayer being laminated alternately and said diamond layers forming outer surfaces of said thin film-layered member, wherein at least one of said diamond layers forming the outer surfaces of the layered member has an outer side surface with a relatively larger surface roughness than that of the interlayer side surface thereof, wherein said interlayer is formed of a brazing alloy containing at least one carbide-forming metal, and further wherein said brazing alloy has a thermal conductivity of not less than about 30 W/(m·K) and a coefficient of thermal expansion ranging from about $10 \times 10^{-6}$ K$^{-1}$ to $35 \times 10^{-6}$ K$^{-1}$.

11. The thin film-layered member of claim 10, wherein said carbide-forming metal is one selected from the group consisting of titanium, zirconium, vanadium, zirconium, tantalum, niobium and hafnium.

12. The thin film-layered member of claim 10, wherein a ratio (a/b) of the sum (a) of thicknesses of said at least one interlayer to the sum (b) of thicknesses of said at least two diamond layers is $0.1 \leq (a/b) \leq 10$.

13. The thin film-layered member of claim 11, wherein said carbide-forming metal is selected from the group consisting of titanium, chromium and vanadium.

14. The thin film-layered member of claim 12, wherein the ratio (a/b) is $0.1 \leq (a/b) \leq 1$.

15. The thin film-layered member of claim 10, wherein said brazing alloy is selected from the group consisting of alloys of tin, silver, copper, gold and lead.

16. The thin film-layered member of claim 1, wherein said carbide-forming metal is present in an amount of from about 0.01 to 20% relative to the amount of brazing alloy used.

17. The thin film-layered member of claim 15, wherein said brazing alloy is Ag—Cu—Ti, Cu—Ga—Cr or Cu—Ga—V brazing alloys.

18. The thin film-layered member of claim 10, wherein said thin film-layered member has a thickness of from about 1 to 200 μm.

* * * * *